(12) United States Patent
Shin et al.

(10) Patent No.: US 10,026,632 B2
(45) Date of Patent: Jul. 17, 2018

(54) WAFER PROCESSING SYSTEM AND WAFER PROCESSING METHOD USING SAME

(71) Applicant: SK hynix Inc., Icheon-si, Gyeonggi-do (KR)

(72) Inventors: Sang Hoon Shin, Cheongju-si (KR); Heyun Su Jang, Seoul (KR); Chang Ho Lee, Seongnam-si (KR); Hee Young Shin, Cheongju-si (KR); Eun Jin Jung, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/406,997

(22) PCT Filed: Nov. 25, 2014

(86) PCT No.: PCT/KR2014/011369
§ 371 (c)(1),
(2) Date: Jan. 16, 2017

(87) PCT Pub. No.: WO2016/021778
PCT Pub. Date: Feb. 11, 2016

(65) Prior Publication Data
US 2017/0178936 A1    Jun. 22, 2017

(30) Foreign Application Priority Data

Aug. 8, 2014    (KR) .................. 10-2014-0102529

(51) Int. Cl.
*H01L 21/67*    (2006.01)
*H01L 21/306*    (2006.01)
*H01L 21/78*    (2006.01)
*H01L 21/304*    (2006.01)
*H01L 23/544*    (2006.01)
*H01L 21/027*    (2006.01)
(Continued)

(52) U.S. Cl.
CPC .. *H01L 21/67294* (2013.01); *H01L 21/02057* (2013.01); *H01L 21/0274* (2013.01); *H01L 21/304* (2013.01); *H01L 21/3081* (2013.01); *H01L 21/30604* (2013.01); *H01L 21/30625* (2013.01); *H01L 21/67155* (2013.01); *H01L 21/78* (2013.01); *H01L 23/544* (2013.01); *H01L 2223/54433* (2013.01); *H01L 2223/54493* (2013.01)

(58) Field of Classification Search
None
See application file for complete search history.

(56) References Cited

U.S. PATENT DOCUMENTS

2006/0085089 A1*  4/2006  Koh .................. G06Q 10/08
                                                 700/115

FOREIGN PATENT DOCUMENTS

| JP | 2010283227 A | 12/2010 |
|----|--------------|---------|
| KR | 1020010062659 A | 7/2001 |
| KR | 1020050033688 A | 4/2005 |

(Continued)

*Primary Examiner* — Asok K Sarkar
(74) *Attorney, Agent, or Firm* — William Park & Associates Ltd.

(57) ABSTRACT

A system for processing a wafer may use a wafer identification (ID) assigned by a wafer manufacturing company as an ID code of the wafer in managing the wafer by a semiconductor manufacturing company.

8 Claims, 16 Drawing Sheets

(51) Int. Cl.
*H01L 21/308* (2006.01)
*H01L 21/02* (2006.01)

(56) References Cited

FOREIGN PATENT DOCUMENTS

| | | |
|---|---|---|
| KR | 1020070024979 A | 3/2007 |
| KR | 1020070063935 A | 6/2007 |
| WO | 2016021778 A1 | 2/2016 |

\* cited by examiner

[FIG. 1]
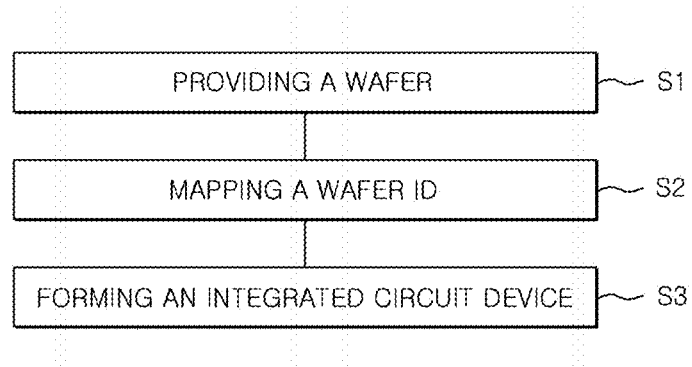
[FIG. 2]
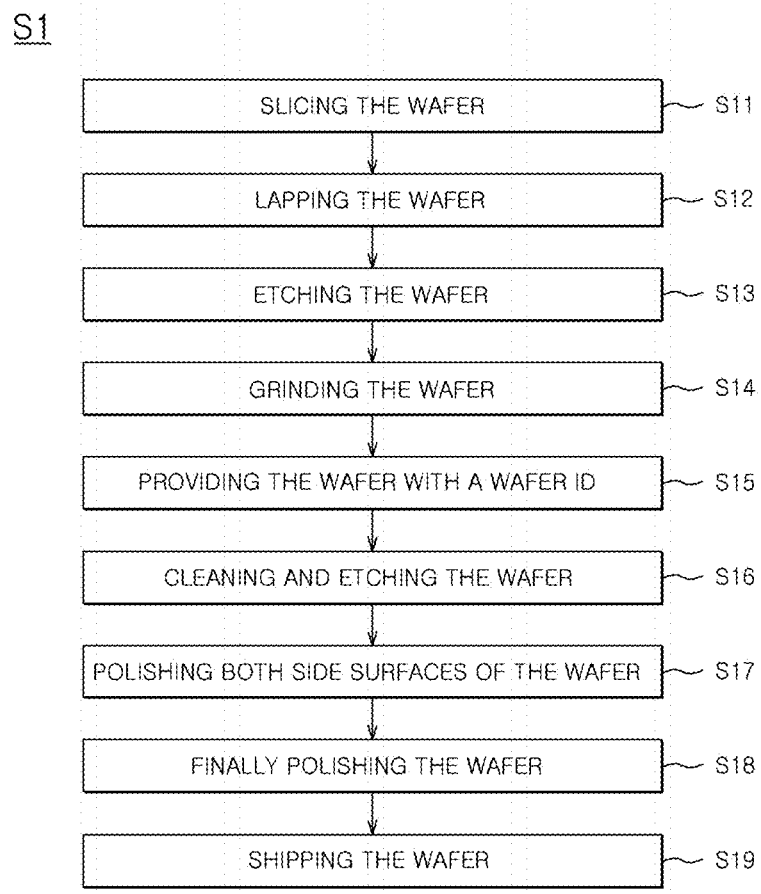

[FIG. 3]
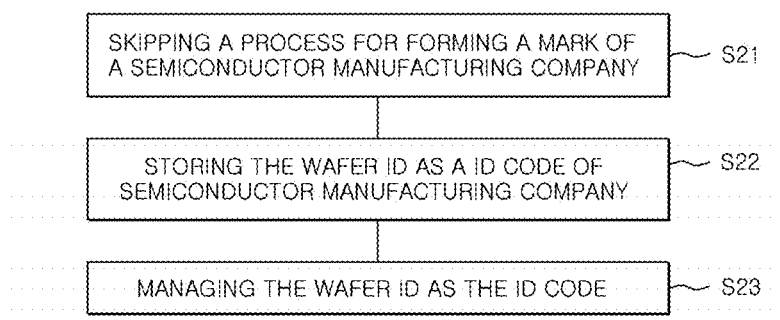
[FIG. 4]
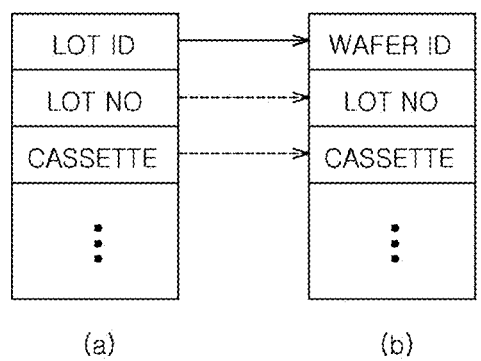

[FIG. 5]
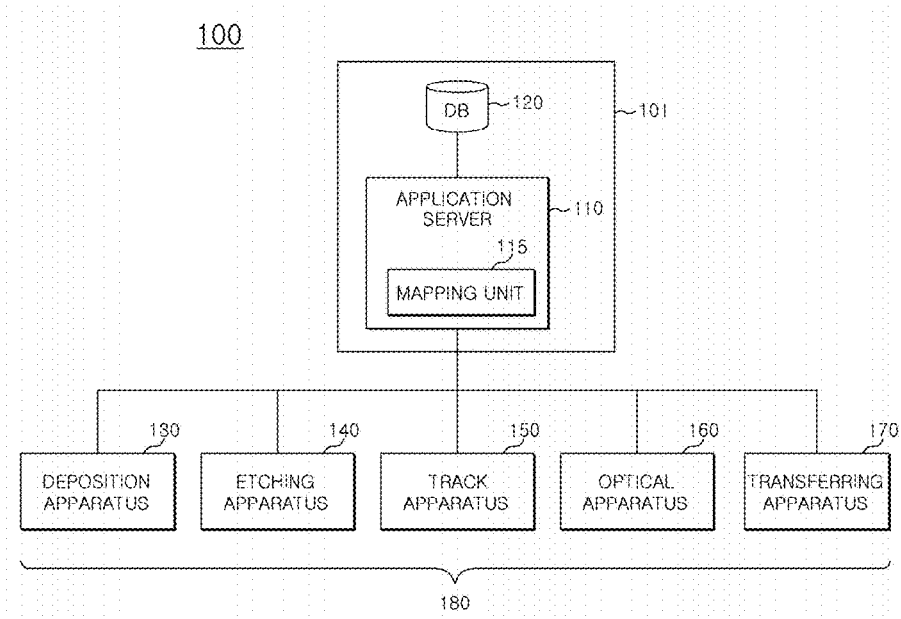
[FIG. 6]
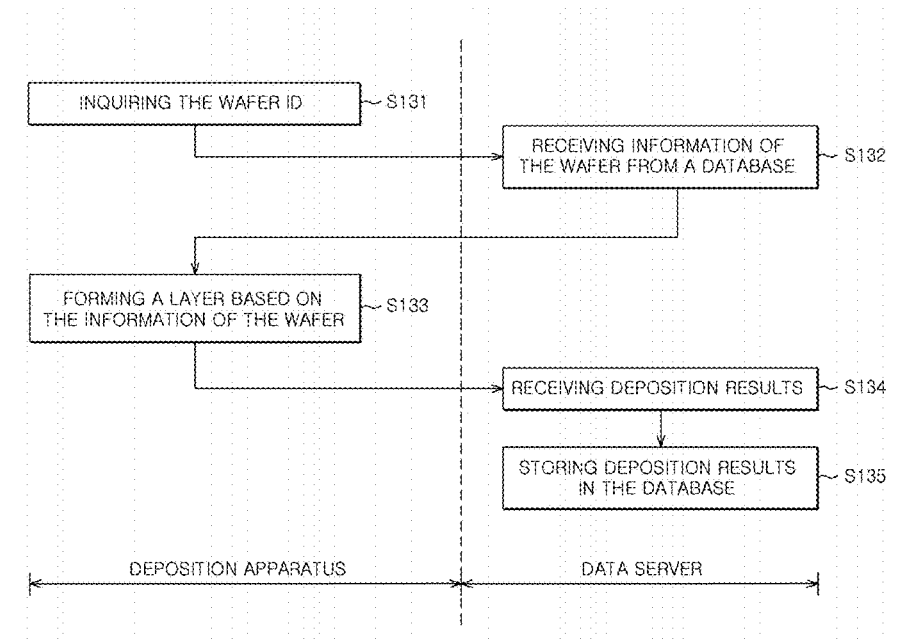

[FIG. 7]
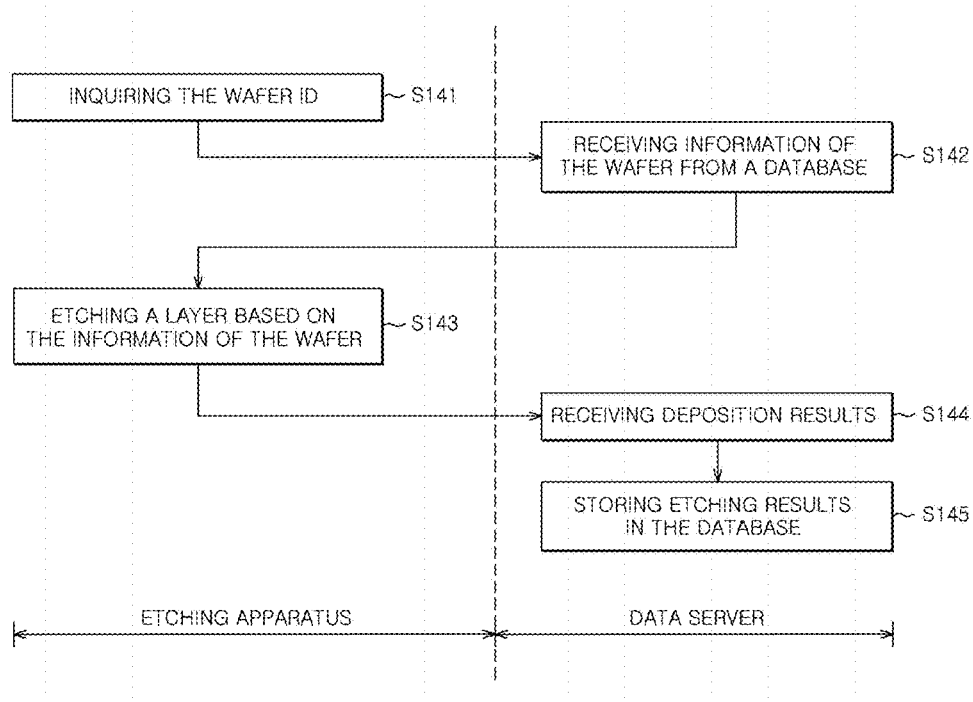
[FIG. 8]
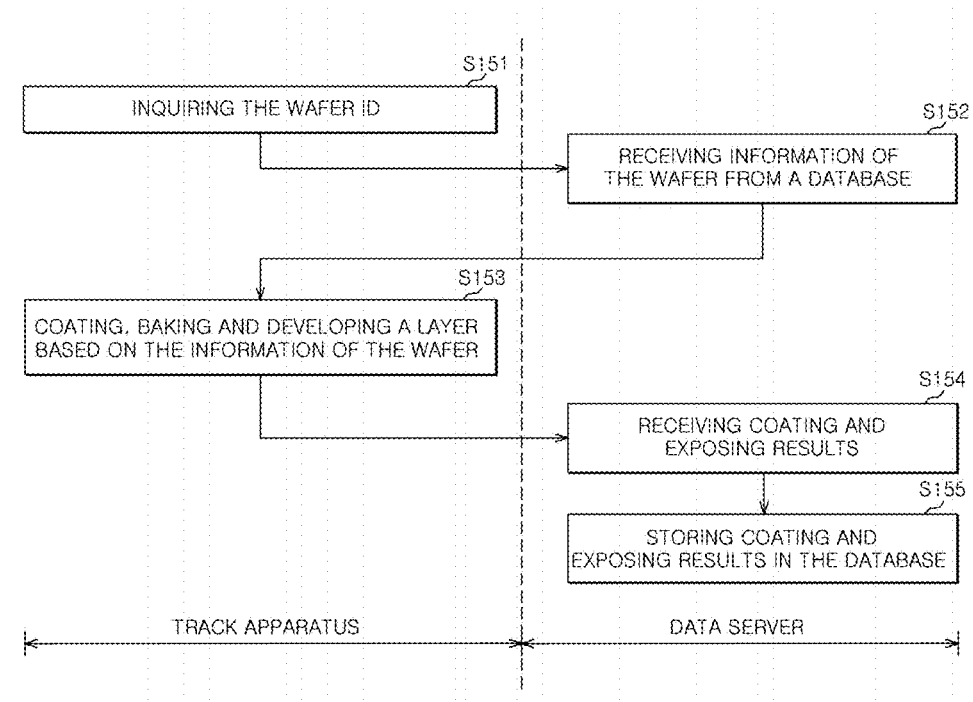

[FIG. 9]
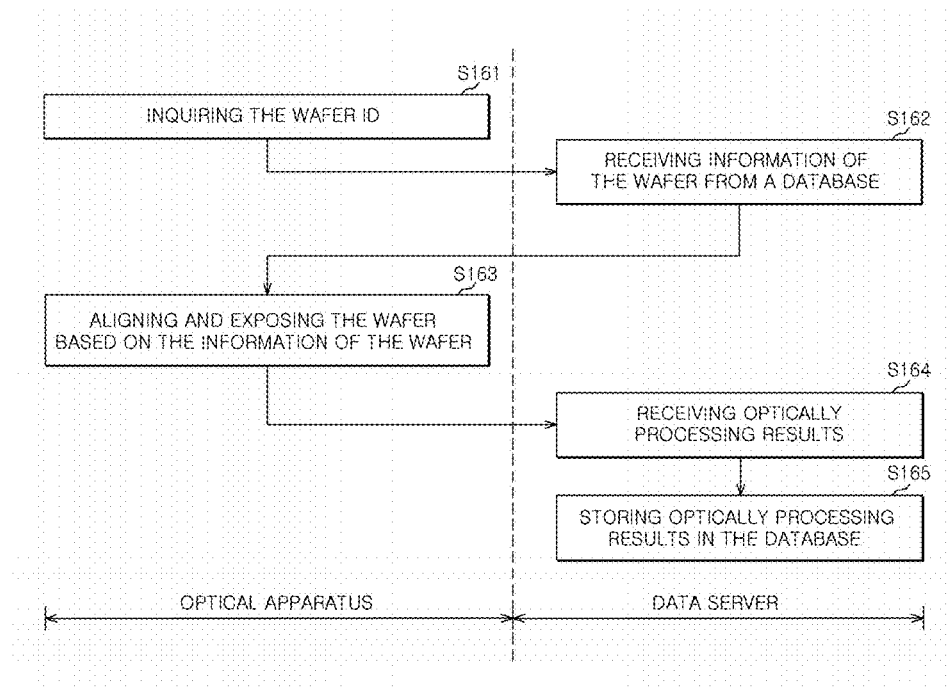
[FIG. 10]
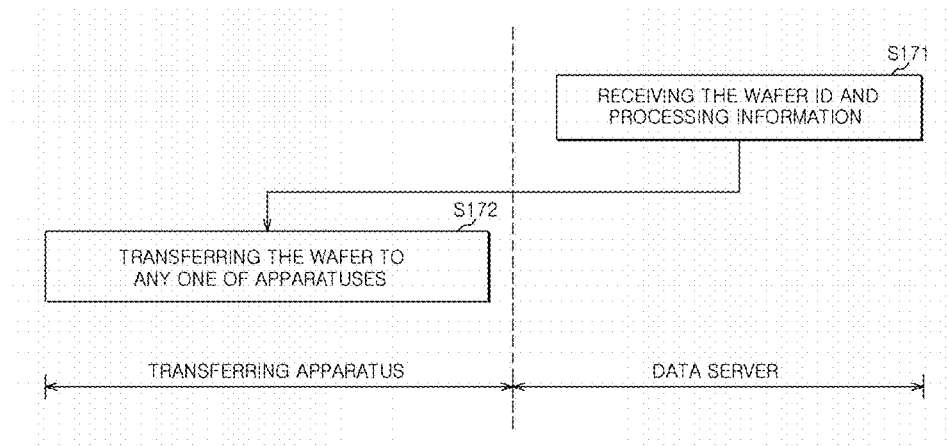

[FIG. 11]
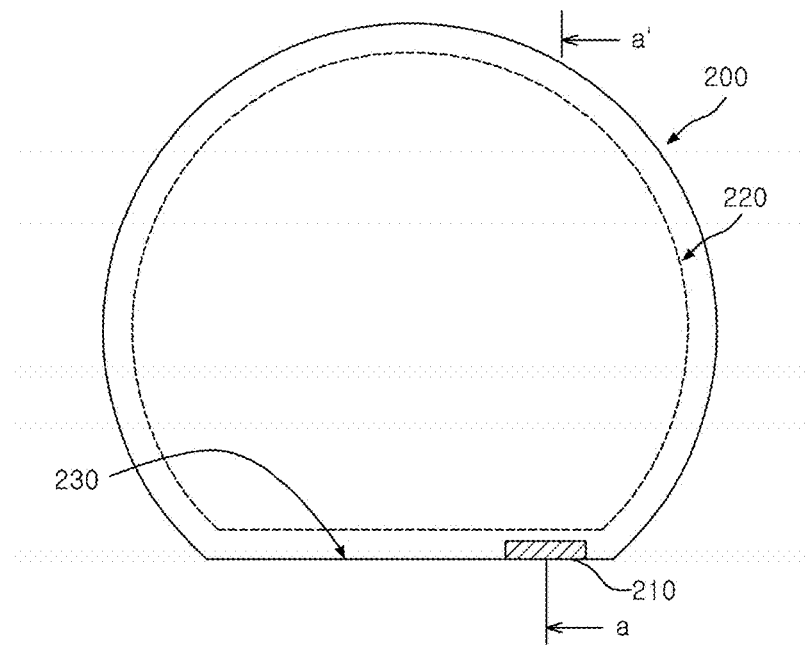
[FIG. 12]
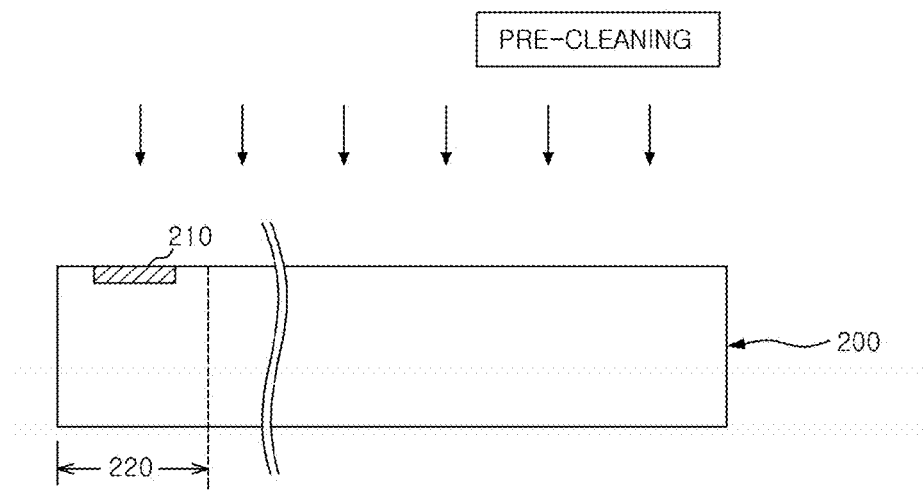

[FIG. 13]
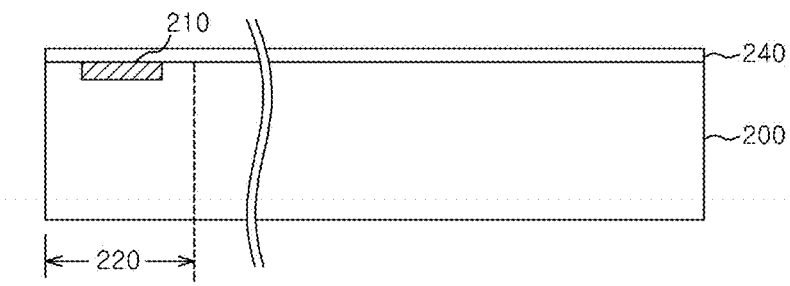
[FIG. 14]
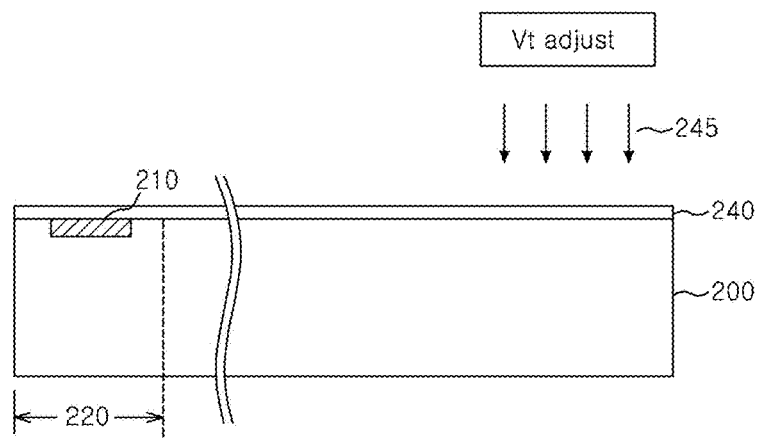
[FIG. 15]
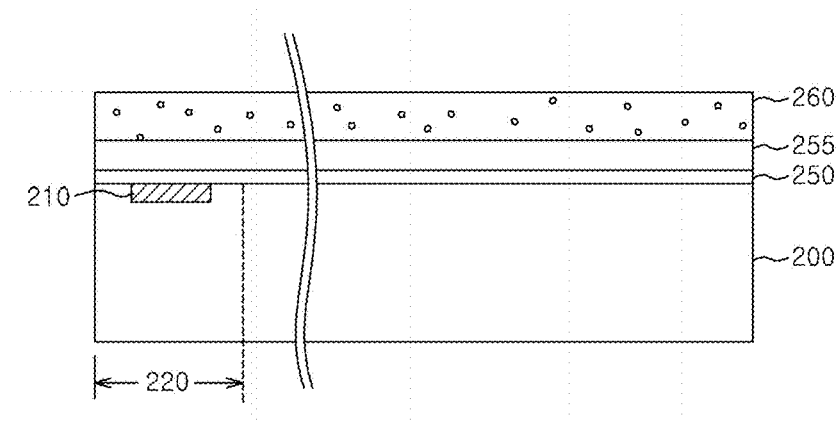

[FIG. 16]
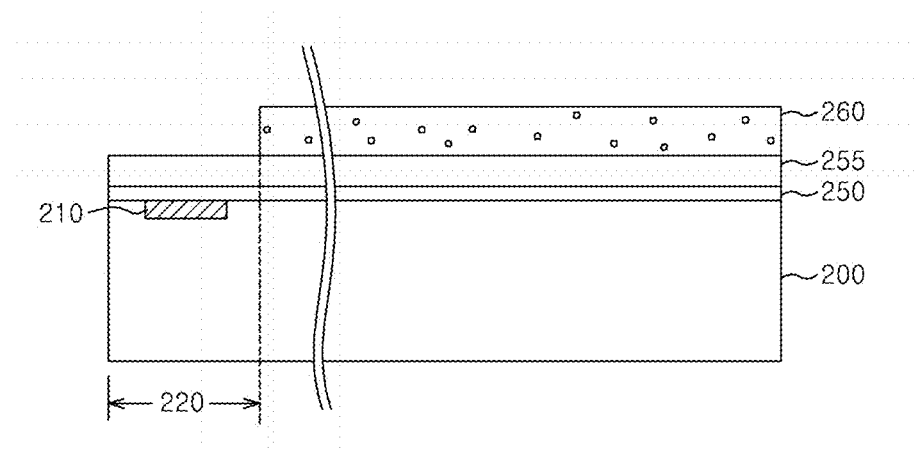

[FIG. 17]
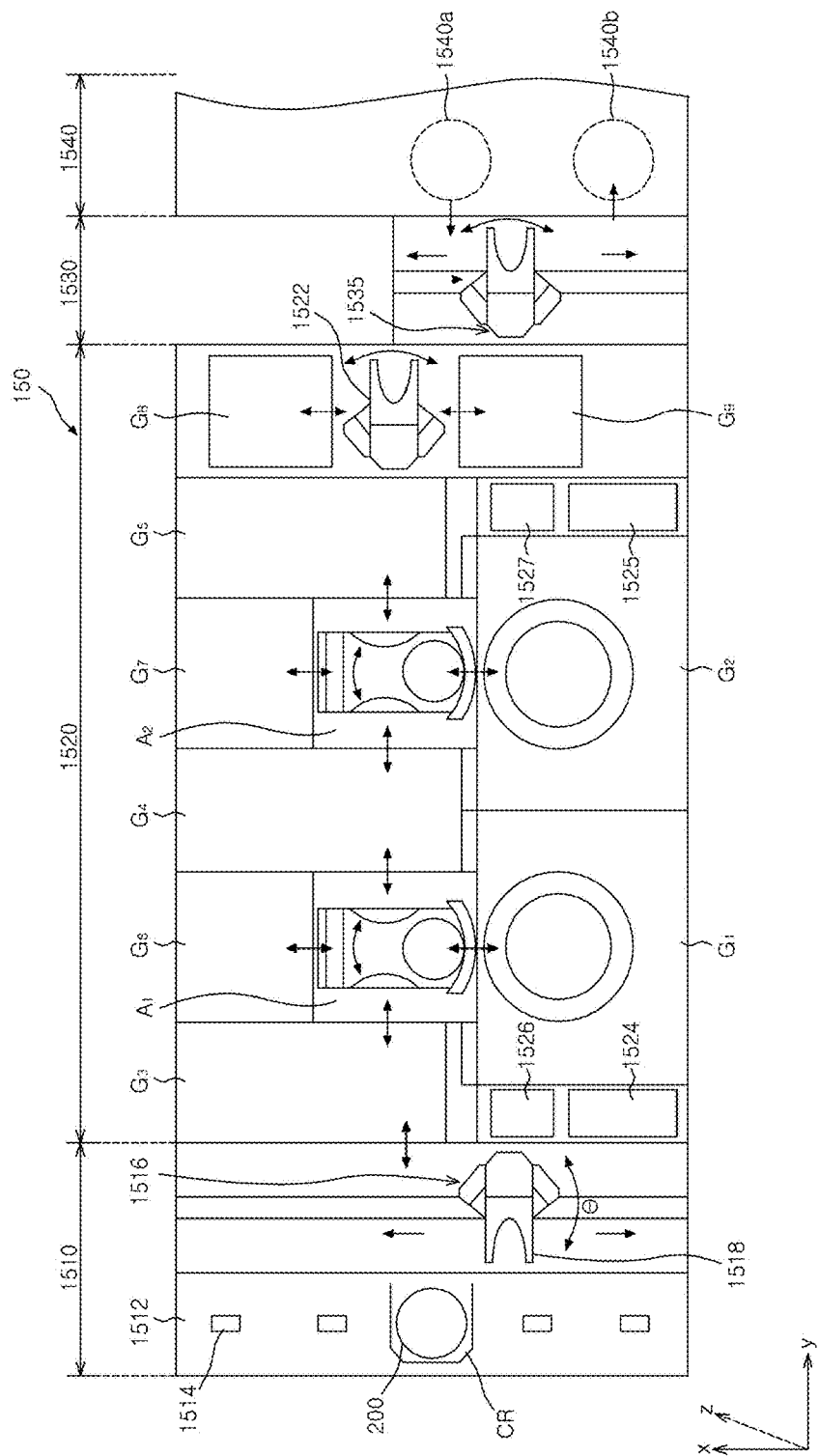

[FIG. 18]
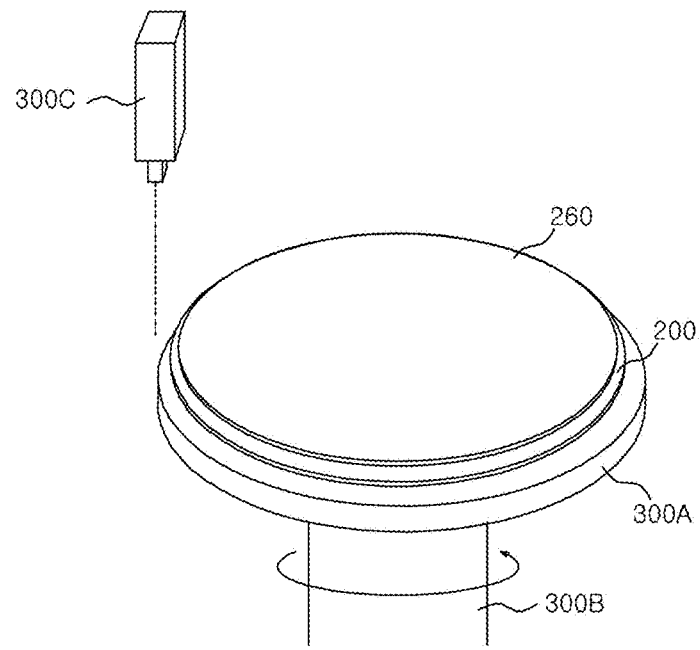
[FIG. 19]
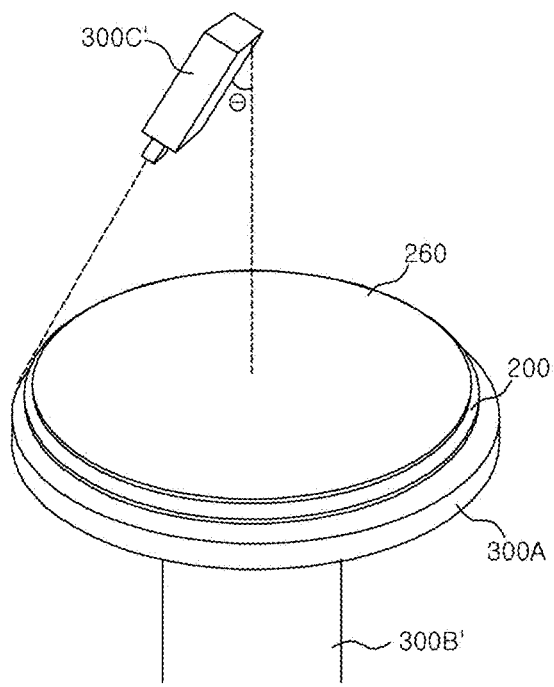

[FIG. 20]
300C,300C'
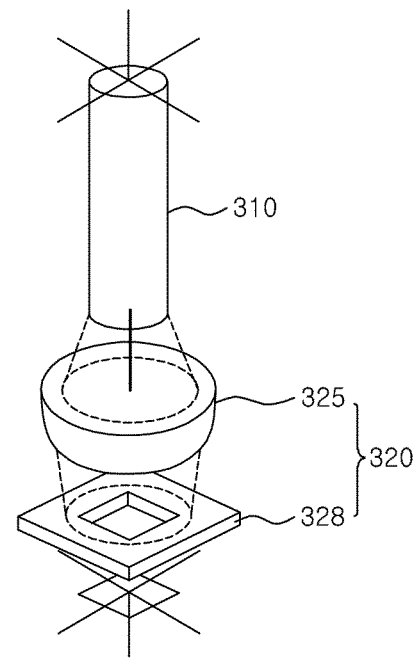
[FIG. 21]
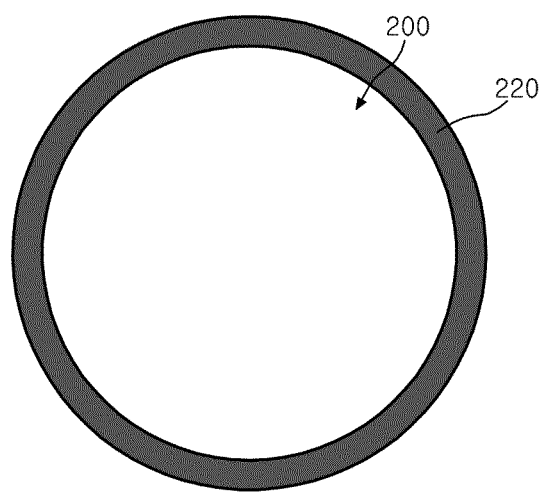

[FIG. 22]
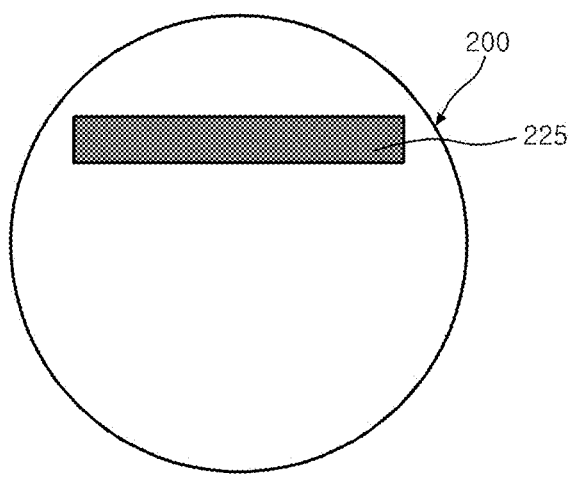
[FIG. 23]
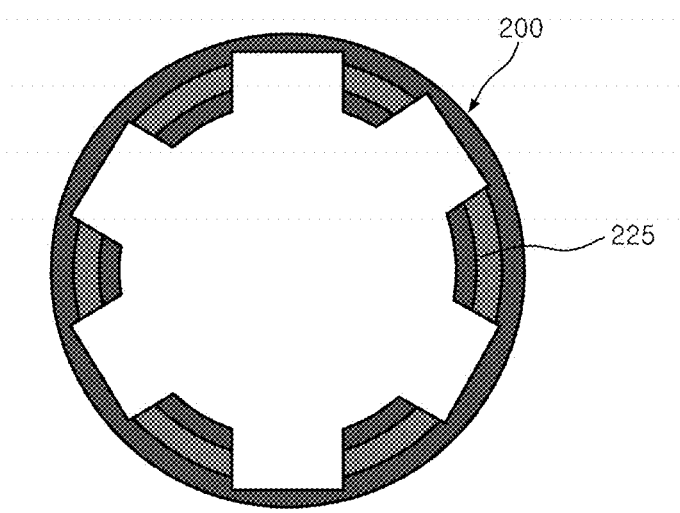

[FIG. 24]
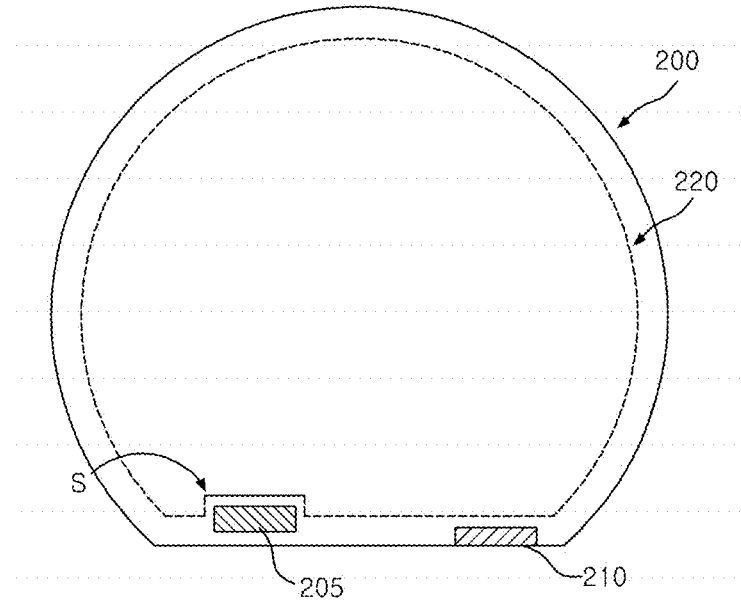
[FIG. 25]
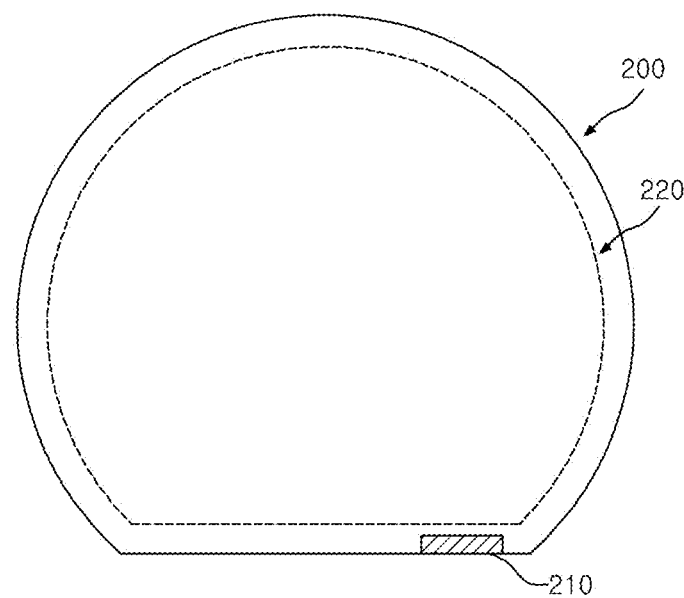

[FIG. 26]
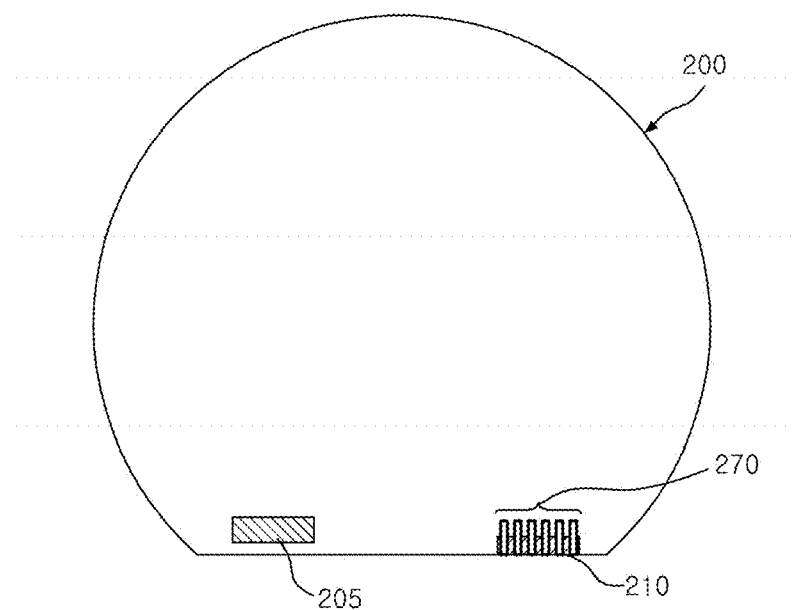
[FIG. 27]
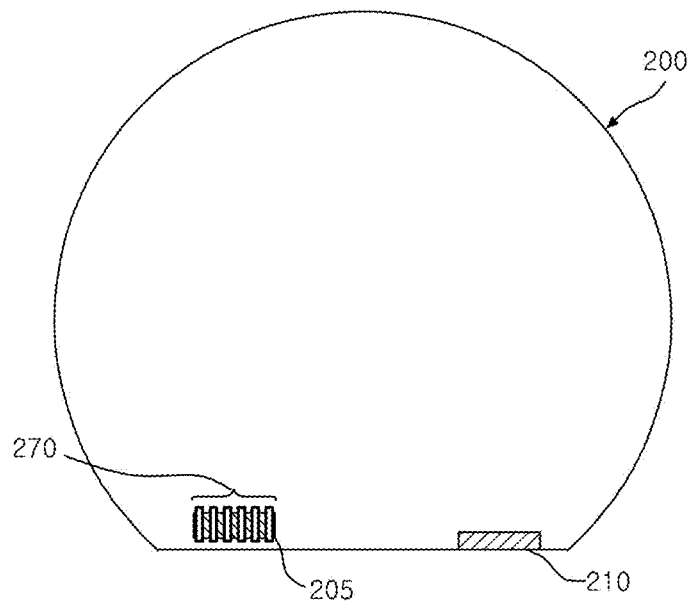

[FIG. 28]
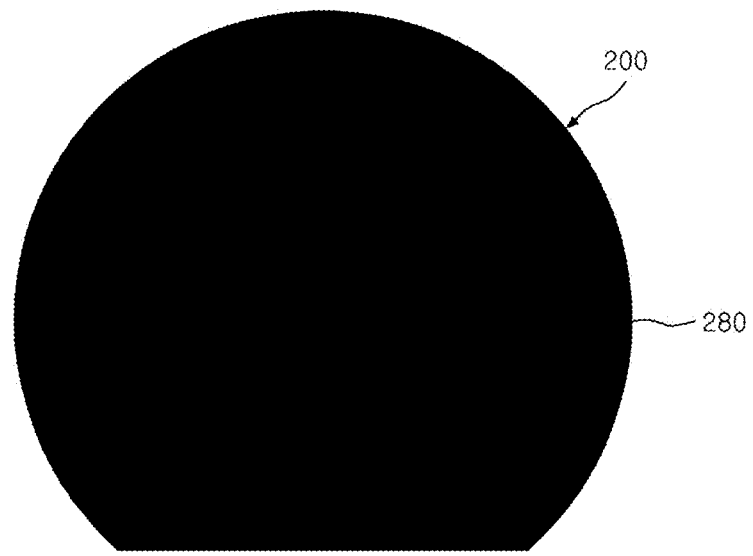
[FIG. 29]
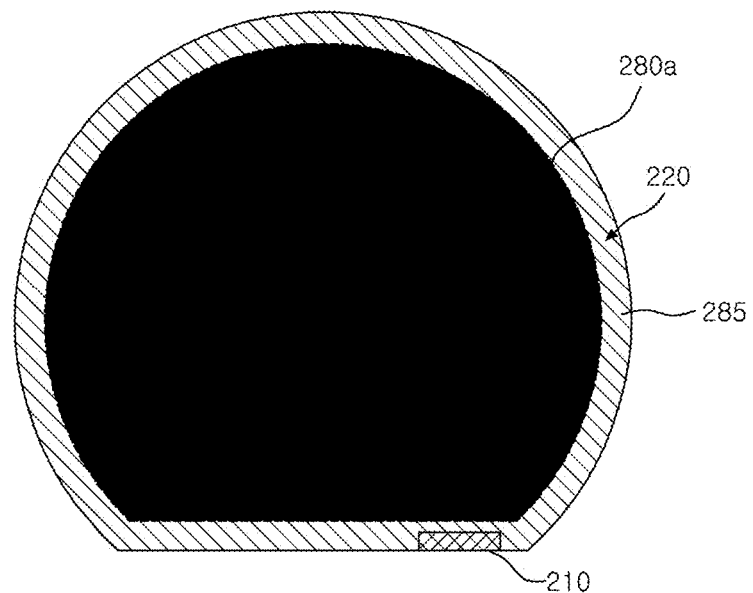

[FIG. 30]
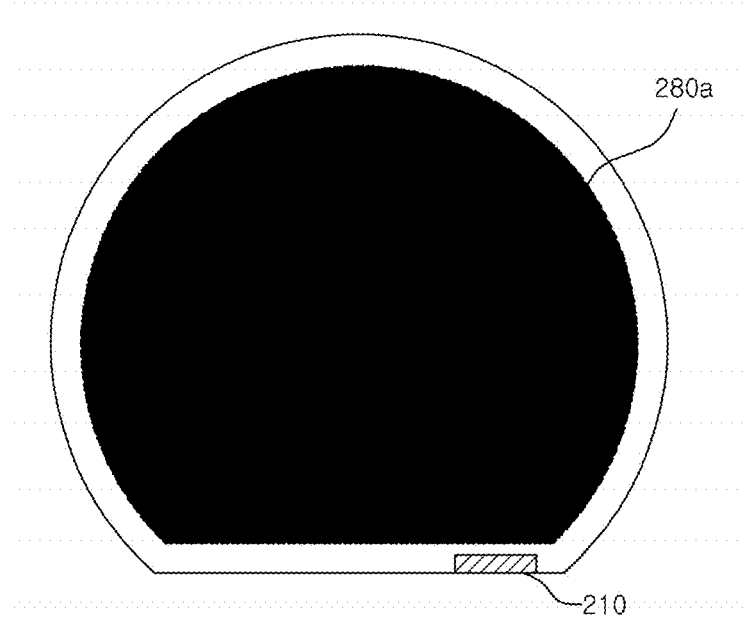

WAFER PROCESSING SYSTEM AND WAFER PROCESSING METHOD USING SAME

TECHNICAL FIELD

Various embodiments generally relate to a system for processing a wafer and a method of processing a wafer using the same, more particularly, to a system for processing a wafer having identification (ID), and a method of processing a wafer using the system.

BACKGROUND ART

In order to manufacture a semiconductor integrated circuit device, various complicated processes may be performed on a wafer. Accurate information managements of the semiconductor integrated circuit device by units may be performed.

In order to manage the information, a semiconductor manufacturing company may provide the wafer, which may be delivered from a wafer manufacturing company, with a laser mark for identifying kinds of circuits in the wafer or LOT numbers. The wafer, which may be processed by a same manufacturing system, may be processed by a single LOT unit by a same process so that the information managements may be readily performed by the laser mark including the LOT numbers.

The laser mark may be formed by irradiating a pulse laser to an edge portion of the wafer. The laser mark may have a dot matrix structure. The laser mark may include an identification number of the semiconductor manufacturing company.

However, when forming the laser mark, particles may be attached to the wafer. The particles may cause a non-uniform thickness of the wafer in an etching process. Further, the particles may cause scratches in a polishing process.

DISCLOSURE OF INVENTION

Technical Problem

Example embodiments may provide a system for processing a wafer and method of processing a wafer using the above-mentioned system.

Solution to Problem

According to an embodiment, there may be provided a system for processing a wafer. The system may use a wafer identification (ID) assigned by a wafer manufacturing company as an ID code of the wafer in managing the wafer by a semiconductor manufacturing company.

According to an embodiment, there may be provided a system for processing a wafer. The system may include a plurality of apparatuses for manufacturing a semiconductor device, an application server and a database. The application server may be configured to map a wafer identification (ID) assigned by a wafer manufacturing company as an ID code of the wafer assigned by a semiconductor manufacturing company. The application server may be communicated with the apparatuses using the wafer ID. The database may store information of the wafer mapped by the wafer ID.

According to an embodiment, there may be provided a method of processing a wafer. In the method of processing the wafer, a semiconductor manufacturing company may map a wafer identification (ID) assigned by a wafer manufacturing company as an ID code of the wafer for the semiconductor manufacturing company. The wafer ID may be identified as the ID code.

According to an embodiment, there may be provided a method of processing a wafer. In the method of processing the wafer, a semiconductor manufacturing company may receive the wafer having a wafer identification (ID) assigned by a wafer manufacturing company. The semiconductor manufacturing company may set the wafer ID as an ID code of the wafer. A semiconductor integrated circuit layer may be formed on the wafer without a laser marking process of the semiconductor manufacturing company. The wafer ID may be opened.

According to an embodiment, there may be provided a method of processing a wafer. In the method of processing the wafer, a wafer ID may be mapped as an ID code of a semiconductor manufacturing company. A surface of the wafer may be pre-processed without a process for forming a mark performed by the semiconductor manufacturing company. A layer may be formed on the wafer. A photoresist film may be formed on the layer. The photoresist film may be exposed to expose an edge portion of the wafer. The layer may be removed using the photoresist film. The edge portion of the wafer may have a size configured to expose the wafer ID.

Advantageous Effect of Invention

According to example embodiments, the semiconductor manufacturing company may not perform a process for forming a laser mark of a LOT ID. The semiconductor manufacturing company may map the wafer ID assigned by the wafer manufacturing company as the LOT ID. Thus, problems caused by the process of the laser mark may not be generated. Further, a yield and time for manufacturing the semiconductor device may be improved.

BRIEF DESCRIPTION OF THE DRAWINGS

FIG. 1 is a flow chart illustrating a method of processing a wafer in accordance with example embodiments;

FIG. 2 is a flow chart illustrating a process for providing a wafer in FIG. 1;

FIG. 3 is a flow chart illustrating a process for mapping a wafer ID in FIG. 1;

FIG. 4 is a block diagram illustrating a managing method of a wafer processing system in accordance with example embodiments;

FIG. 5 is a block diagram illustrating a wafer processing system in accordance with example embodiments;

FIG. 6 is a block diagram illustrating a wafer processing process between a deposition apparatus and an application server in accordance with example embodiments;

FIG. 7 is a block diagram illustrating a wafer processing process between an etching apparatus and an application server in accordance with example embodiments;

FIG. 8 is a block diagram illustrating a wafer processing process between a track apparatus and an application server in accordance with example embodiments;

FIG. 9 is a block diagram illustrating a wafer processing process between an optical apparatus and an application server in accordance with example embodiments;

FIG. 10 is a block diagram illustrating a wafer processing process between a transferring apparatus and an application server in accordance with example embodiments;

FIG. 11 is a plan view illustrating a wafer in accordance with example embodiments;

FIGS. 12 to 16 are cross-sectional views illustrating a method of initially processing a wafer in accordance with example embodiments;

FIG. 17 is a plan view illustrating a track apparatus in accordance with example embodiments;

FIG. 18 is a perspective view illustrating a WEE unit in accordance with example embodiments;

FIG. 19 is a perspective view illustrating a WEE unit in accordance with example embodiments;

FIG. 20 is a perspective view illustrating a lamp structure of a WEE unit in accordance with example embodiments;

FIGS. 21 to 23 are plan views illustrating a wafer exposed by a WEE unit in accordance with example embodiments;

FIG. 24 is a plan view illustrating a wafer having a LOT ID processed by a WEE unit in accordance with example embodiments;

FIG. 25 is a plan view illustrating a wafer having a LOT ID processed by a WEE unit in accordance with example embodiments;

FIG. 26 is a plan view illustrating a wafer having a dummy pattern in accordance with example embodiments;

FIG. 27 is a plan view illustrating a wafer having a dummy pattern in accordance with example embodiments; and FIGS. 28 to 30 are cross-sectional views illustrating an EBR processing processes in accordance with example embodiments.

BEST MODE FOR CARRYING OUT THE INVENTION

Hereinafter, examples of the embodiments will be explained with reference to the accompanying drawings.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

Referring to FIG. 1, a method of processing a wafer in accordance with example embodiments may include a step S1 for receiving a wafer, a step S2 for mapping a wafer ID and a step S3 for forming a semiconductor integrated circuit device on the wafer mapped by the wafer ID.

Referring to FIG. 2, the step S1 for receiving the wafer may include a step S11 for slicing a single crystalline ingot by the wafer, a step S12 for lapping the sliced wafer, a step S13 for etching the lapped wafer, a step S14 for grinding the etched wafer, a step S15 for providing an edge portion of the wafer with an ID of a wafer manufacturing company, a step S16 for cleaning and etching the wafer, a step S17 for polishing both side surfaces of the wafer, a step S18 for finally polishing the wafer, and a step S19 for shipping the wafer to a semiconductor manufacturing company.

The slicing step S11 may include cutting the single crystalline ingot having a volume by the wafer. The slicing step S11 may include cutting the single crystalline ingot having an edge portion to which a diamond particle may be fixed or cutting the single crystalline ingot using a high tensile wire to which a slurry solution may be sprayed.

The lapping step S12 may include closely contacting the both side surfaces of the wafer to upper and lower surface plates, and injecting an abrasive and slurry between the upper and lower surface plates to planarize the wafer. The lapping step S12 may function as to reduce defects of mechanical processes. The lapping step S12 may function as to decrease a thickness deviation of the wafer generated in the slicing step S11.

The etching step S13 may function as to remove mechanical damages of the wafer generated in the lapping step S12.

The grinding step S14 may function as to improve flatness of the wafer.

The step S15 for providing the wafer with the ID may include irradiating a laser having a lower power to the edge portion of the wafer to form dots having several to dozens micrometers of depth. The wafer ID may be used for individually identifying the wafers by the wafer manufacturing company.

The cleaning and etching process S16 may function as to remove fragments generated in irradiating the laser.

In order to improve non-uniformity caused by the wafer ID, the both polishing step S17 and the final polishing step S18 may be performed. The wafer may be shipped to the semiconductor manufacturing company. The above-mentioned step S1 may be serially performed by the wafer manufacturing company.

The semiconductor manufacturing company may receive the wafer from the wafer manufacturing company. The semiconductor manufacturing company may map the wafer ID on an ID code or a LOT ID for the semiconductor manufacturing company in a wafer processing system.

Referring to FIG. 3, the mapping step S2 may include a step S21 for skipping the laser marking process, a step S22 for storing the wafer ID assigned by the wafer manufacturing company as the ID code for the semiconductor manufacturing company, and a step S23 for managing and using the wafer ID as the ID code or the LOT ID.

Referring to FIG. 4, in (a) section, after the wafer may be delivered to the semiconductor manufacturing company, an ID code, for example, a LOT ID for the semiconductor manufacturing company may be marked on the wafer. Records of the wafer may be stored and managed by the marked ID code in mapping data. In contrast, according to example embodiments, in (b) section, the wafer ID may be mapped as the ID code for the semiconductor manufacturing company without storing of the ID code. The information and the records of the wafer may be managed in accordance with the wafer ID.

Referring to FIG. 5, a wafer processing system 100 may include a server 101. The server 101 may include an application server 110 and database DB 120. The application server 110 may be communicated with semiconductor manufacturing apparatuses 180 such as a deposition apparatus 130, an etching apparatus 140, a track apparatus 150, an optical apparatus 160, a transferring apparatus 170, etc. Although not depicted in drawings, the semiconductor manufacturing apparatuses 180 may further include other apparatuses as well as the above-mentioned apparatuses. The application server 110 may be communicated with the semiconductor manufacturing apparatuses through network lines such as LAN. The information may be exchanged between the application server 110 and the semiconductor manufacturing apparatuses. The information may be stored in the database 120.

The application server 110 may include a mapping unit 115 configured to identify the wafer ID as the ID code. The database 120 may be configured to store the information of the wafer mapped by the mapping unit 115.

Referring to FIG. 6, in order to form a layer on the wafer, the wafer may be transferred to the deposition apparatus 130 by the transferring apparatus 170. In step S131, the deposition apparatus 130 may inquire the wafer ID as the ID code of the wafer in place of the LOT ID. In step S132, the application server 110 may provide the deposition apparatus 130 with the information of the wafer corresponding to the wafer ID from the database 120. In step S133, the deposition apparatus 130 may form the layer on the wafer based on the information of the wafer. In step S134, the deposition apparatus 130 may provide the application server 110 with deposition data such as a deposition material, a deposition thickness, etc. In step S135, the application server 110 may store the deposition data in the database 120.

Referring to FIG. 7, the wafer may be transferred to the etching apparatus 140 by the transferring apparatus 170. In step S141, the etching apparatus 140 may inquire the wafer ID as the ID code of the wafer in place of the LOT ID. In step S142, the application server 110 may provide the etching apparatus 140 with the information of the wafer corresponding to the wafer ID from the database 120. In step S143, the etching apparatus 140 may etch the layer on the wafer based on the information of the wafer. In step S144, the etching apparatus 140 may provide the application server 110 with etching data such as an etching material, an etching thickness, an etching position, etc. In step S145, the application server 110 may store the etching data in the database 120.

Referring to FIG. 8, in order to coat an organic layer such as a photoresist film on the wafer, the wafer may be transferred to the track apparatus 150 by the transferring apparatus 170. In step S151, the track apparatus 150 may inquire the wafer ID as the ID code of the wafer in place of the LOT ID. In step S152, the application server 110 may provide the track apparatus 150 with the information of the wafer corresponding to the wafer ID from the database 120. The track apparatus 150 may correspond to an apparatus for coating, baking, exposing and developing the organic layer. In step S153, the track apparatus 150 may coat, expose and develop the organic layer on the wafer based on the information of the wafer. In step S154, the track apparatus 150 may provide the application server 110 with tracking data such as a photoresist material, a photoresist thickness, a position of a pattern, etc. In step S155, the application server 110 may store the tracking data in the database 120.

Referring to FIG. 9, the wafer may be transferred to the optical apparatus 160 by the transferring apparatus 170. In step S161, the optical apparatus 160 may inquire the wafer ID as the ID code of the wafer in place of the LOT ID. In step S162, the application server 110 may provide the optical apparatus 160 with the information of the wafer corresponding to the wafer ID from the database 120. In step S143, the optical apparatus 160 may perform an alignment process or an exposure process based on the information of the wafer. In step S164, the optical apparatus 160 may provide the application server 110 with optical data such as a position of a mask, a wavelength of a light, etc. In step S165, the application server 110 may store the etching data in the database 120.

Referring to FIG. 10, the application server 110 may provide the transferring apparatus 170 with the wafer ID and information of the wafer. In step S171, the transferring apparatus 170 may identify a position of the wafer such as positions of LOT and a cassette from the wafer ID and the information of the wafer. In step S172, the transferring apparatus 170 may transfer the wafer from the cassette to any one of the semiconductor manufacturing apparatuses.

Further, although not depicted in drawings, a thermal treatment apparatus may inquire the wafer ID to obtain the information of the wafer. The thermal treatment apparatus may perform a thermal process based on the information of the wafer.

Form for the Execution of the Invention

Referring to FIG. 11, the wafer ID 210 may be formed at an edge portion of the wafer 200, for example, a wafer flat region 230. That is, before delivering the wafer to the semiconductor manufacturing company, the wafer ID 210 may be formed by the laser marking performed in the wafer manufacturing company. The wafer ID 210 may include a combination of numbers and alphabetical characters similarly to the LOT ID. The wafer ID 210 formed by the wafer manufacturing company may be formed using the laser having a lower power so that the wafer ID 210 may have a dot depth and a size less than those of the LOT ID.

Referring to FIG. 12, the semiconductor manufacturing company delivered the wafer 200 from the wafer manufacturing company may map the wafer ID 210 with the ID code or LOT ID of the semiconductor manufacturing company without the laser marking process. The surface of the wafer 200 may be pre-cleaned.

Referring to FIG. 13, a screen oxide layer 240 may be formed on the surface of the pre-cleaned wafer 200.

Referring to FIG. 14, the threshold voltage adjusting ion 245 may be implanted into the wafer 200. A threshold voltage of transistor in the wafer may be controlled by the threshold voltage adjusting ion 245.

Referring to FIG. 15, the screen oxide layer 240 may then be removed. A pad oxide layer 250 and a silicon nitride layer 255 may be sequentially formed on the wafer 200. The wafer 200 may be loaded into the track apparatus 150. A photoresist film 260 may be coated on the silicon nitride layer 255.

Referring to FIG. 16, a wafer edge exposure (WEE) process may be performed on the photoresist film 260 to expose the edge portion 220 of the wafer 200. Thus, a portion of the silicon nitride layer 255 in the edge portion 220 of the wafer 200 may be exposed by the WEE process. The silicon nitride layer 255 may be etched using the photoresist film 260 as an etch mask to expose the wafer ID 210.

The WEE process may function as to remove a layer on the edge portion of the wafer for reducing contamination of the apparatus during clamping the wafer 200. In example embodiments, the WEE process may be performed simultaneously with exposing the wafer ID 210.

Referring to FIG. 17, the process for coating the photoresist film 260 and the WEE process may be performed in the track apparatus 150. The track apparatus 150 may include a cassette block 1510, a processing block 1520, an interface block 1530 and an exposing block 1540.

The cassette block 1510 may include a wafer cassette CR configured to receive the wafers 200. The wafer cassette CR may be loaded into the track apparatus 150 from an external apparatus. The wafers in the wafer cassette CR to which the track process may be performed may be unloaded from the track apparatus 150 to an external apparatus. The cassette block 1510 may transfer the wafers between the wafer cassette CR and the processing block 1520. A reference numeral 1512 may indicate a cassette support, and a reference numeral 1514 may indicate a position-fixing member of the wafer cassette CR.

The cassette block 1510 may further include a first transferring unit 1516 arranged between the cassette support 1512 and the processing block 1520. The first transferring unit 1516 may include a wafer pick 1518 moved in an arranging direction of the cassette, i.e., an x-direction and in an arranging direction of the wafers in the wafer cassette CR, i.e., a y-direction. The wafer pick 1518 may be rotated in a θ direction.

The processing block 1520 may include a plurality of feeding units A1 and A2 arranged between a plurality of processing groups G1-G9. For example, the first feeding unit A1 may be positioned between the first, third, fourth and fifth processing groups G1, G3, G4 and G5. The second feeding unit A2 may be positioned between the second, fourth, fifth and seventh processing groups G2, G4, G5 and G7.

The first processing group G1 may include a coating unit configured to perform a process after loading the wafer 200 on a spin chuck. The second processing group G2 may include a developing unit configured to perform a hydrophobic process on an exposed resist material. The third to sixth processing groups G3, G4, G5 and G6 may include a baking unit configured to heating the wafer. The third to sixth processing groups G3, G4, G5 and G6 may perform a pre-baking process and a post-baking process.

The seventh processing group G7 may include a measuring unit configured to measure a thickness of the resist layer, and a WEE unit configured to selectively expose the edge portion of the wafer.

The eighth processing group G8 may include a cassette configured to receive the wafers unloaded from the exposing block 1540, and a post WEE unit configured to remove the edge portion of the exposed wafer.

The ninth processing group G9 may include a stage on which the wafer 200 may be positioned. A second transferring unit 1522 may be positioned between the eighth processing group G8 and the ninth processing group G9 to transfer the wafer between the eighth processing group G8 and the ninth processing group G9. Reference numerals 1524 and 1525 may indicate a liquid temperature control pump configured to supply the photoresist material to the first and second processing groups G1 and G2. Reference numerals 1526 and 1527 may indicate a duct configured to provide the processing groups G1-G9 with a clean air.

The interface block 1530 may be configured to transfer the wafer between the processing block 1520 and the exposing block 1540. The interface block 1530 may include a third transferring unit 1535 moved in vertical and horizontal directions.

The exposing block 1540 may correspond to the optical apparatus 160. The exposing block 1540 may include an inner stage 1540a and an outer stage 1540b. The exposing block 1540 may be configured to align a reticle and expose the wafer.

Hereinafter, operations for forming the photoresist pattern 260 using the track apparatus 150 may be illustrated in detail.

The wafers 200 in the wafer cassette CR may be transferred one by one to the processing unit 1520. The coating process, the baking process and the WEE process may be performed on the wafer 200. The wafer 200 may be transferred to the exposing block 1540 through the interface block 1530. The wafer 200 exposed by the exposing block 1540 may be transferred to the developing unit of the processing unit 1520 to perform an insolubilization process. The wafer 200 may be hard-baked to form the photoresist pattern 260.

Referring to FIGS. 18 and 19, the WEE units G7 and G8 may include a stage 300A, shafts 300B and 300B' and lamp structure 300C and 300C'.

The wafer 200 on which the coating process or the exposing process may be performed may be placed on the stage 300A. The shafts 300B and 300B' may be arranged on a bottom surface of the stage 300A to support the stage 300A. As shown in FIG. 18, the shaft 300B may have a rotary structure. In this case, the lamp structure 300C may have a fixed type. In contrast, as shown in FIG. 19, the shaft 300B' may have a fixed structure. In this case, the lamp structure 300C' may be rotated with respect to a rotational shaft inclined to a central axis of the stage 300A at an angle θ1.

Referring to FIG. 20, the lamp structures 300C and 300C' may include a light source, a light-guiding member 310 and a focusing member 320. The light-guiding member 310 may be configured to transmit a light emitted from the light source to the focusing member 320. The focusing member 320 may include a plurality of lens structures 325 and a slit 328. The lens structures 325 may be configured to focus the light provided from the light-guiding member 310 and to transmit the focused light to the slit 328. The slit 328 may function as to determine an exposed area.

Referring to FIG. 21, the light may be irradiated to the edge portion of the wafer 200 by the rotation of the shaft 300B or the lamp structure 300C'. The WEE units G7 and G8 may selectively expose the edge portion 220 of the wafer 200.

Referring to FIG. 22, the WEE units G7 and G8 may irradiate the linear light to the wafer 200. Alternatively, referring to FIG. 23, the WEE units G7 and G8 may be locally irradiate the light to the edge portion 220 of the wafer 200. A reference numeral 225 may indicate an exposed region.

When a LOT ID 225 may be provided to the wafer 200, the WEE units G7 and G8 may simultaneously open the edge portion 220 of the wafer 220 and the LOT ID 225. Here, a width the edge portion 220 of the wafer 200 to which the WEE process may be performed may be determined in accordance with an effective die of the wafer 200. The width of the edge portion 220 of the wafer 200 may be less than a width of the LOT ID 205. For example, a width of a round type WEE open region may be about 2.3 mm. A width of the LOT ID 205 may be about 3.5 mm. In this case, as shown in FIG. 24, most regions of the wafer 200 may have a predetermined width. The edge portion 200 of the wafer 200 may be opened. A size of the slit 328 at a peripheral portion of the LOT ID 205 may be changed to fully open the LOT ID 205. However, a stepped portion s may be generated at the peripheral portion of the LOT ID 205 due to the size change of the slit 328. The stepped portion s may act as particles to cause defects of the wafer 200.

According to example embodiments, the method may not include the process for forming the LOT ID 205. The wafer ID 210 may be mapped as the ID code of the wafer 200. Because the size of the wafer ID 210 may be about 2 mm, performing the WEE process and opening the wafer ID 210 may be performed simultaneously with each other without the size change of the slit 328. Thus, because the size of the slit 328 may not be changed in the WEE process, the WEE process may be simplified. Further, the stepped portion s may not be formed to prevent the particles from being generated.

Referring to FIG. 26, the wafer ID 210 assigned by the wafer manufacturing company may be a negligible factor in the semiconductor manufacturing company. Therefore, a dummy pattern 270 may be formed on the wafer ID 210.

Referring to FIG. 27, the wafer ID 210 may be recognized as the ID code of the wafer in the semiconductor manufacturing company. Thus, it may be required to change positions of the dummy patterns 270 on the wafer ID 210. In example embodiments, the wafer 200 may not include the LOT ID. Thus, the dummy pattern 270 may be positioned at a region of the wafer 200 where the LOT ID may be formed. The region of the wafer 200 where the LOT ID may be formed may have an area larger than an area of a region where the wafer ID 210 may be positioned so that the dummy pattern 270 may be readily formed. Alternatively, the position of the dummy pattern 270 may not be restricted within a specific region of the wafer 200.

A method of manufacturing the semiconductor device may include a process for forming a metal wiring. The metal wiring may include an aluminum layer, an aluminum alloy layer, etc. Recently, the metal wiring may include a copper layer. Because the copper layer may not be easily etched, a chemical mechanical polishing (CMP) process may be performed on the copper layer. After performing the CMP process on the copper layer, a copper seed layer and a copper atom may remain at the edge portion 220 of the wafer 200 to contaminate the transferring apparatus. Thus, after forming the copper layer, an edge bead removal (EBR) process may be performed.

Referring to FIG. 28, a shadow mask layer 280 may be formed on the wafer 200 having the copper layer. The shadow mask layer 280 may include a photoresist material.

Referring to FIG. 29, the shadow mask layer 280 on the edge portion 220 of the wafer 200 may be selectively removed by the EBR process to form a shadow mask 280a. The EBR process may be substantially similar to the WEE process. The shadow mask 280 may be configured to expose the copper layer 285 on the edge portion 220 of the wafer 200. The wafer ID 210 may be covered with the copper layer 285.

Referring to FIG. 30, the exposed copper layer 285 may be removed using a chemical solution such as a nitric acid solution so that the wafer ID 210 may be opened by the EBR process.

INDUSTRIAL AVAILABILITY

According to example embodiments, the semiconductor manufacturing company may not perform a process for forming a laser mark of a LOT ID. The semiconductor manufacturing company may map the wafer ID assigned by the wafer manufacturing company as the LOT ID. Thus, problems caused by the process of the laser mark may not be generated. Further, a yield and time for manufacturing the semiconductor device may be improved.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

The invention claimed is:

1. A method of processing a wafer, the method comprising:
   receiving a wafer, which has not undergone any processing, having a wafer identification (ID) assigned by a wafer manufacturing company;
   mapping the wafer ID of the wafer with an ID code for processing the wafer in a semiconductor manufacturing company, without performing a laser marking process for forming the ID code of the wafer; and
   recognizing the wafer ID as the ID code in all processes processed in the semiconductor manufacturing company.

2. A method of processing a wafer, the method comprising:
   receiving a wafer, which has not undergone any processing, having a wafer identification (ID) from a wafer manufacturing company;
   setting the wafer ID of the wafer as an ID code for processing the wafer in a semiconductor manufacturing company, without performing a laser marking process for forming the ID code of the wafer;
   forming a semiconductor integrated circuit layer using the wafer ID; and
   opening the wafer ID after forming the semiconductor integrated circuit layer.

3. The method of claim 2, wherein opening the wafer ID comprises removing the semiconductor integrated circuit layer on an edge portion of the wafer.

4. The method of claim 3, wherein opening the wafer ID comprises:
   forming a resist layer on the semiconductor integrated circuit layer;
   exposing the resist layer on the edge portion of the wafer to remove the resist layer on the edge portion of the wafer; and
   etching the semiconductor integrated circuit layer using the exposed resist layer as an etch mask.

5. The method of claim 4, wherein the edge portion of the wafer has a size substantially equal to or greater than a size of the wafer ID.

6. The method of claim 2, wherein the wafer ID is opened by a track apparatus configured to coat, expose and develop the resist layer.

7. The method of claim 2, further comprising cleaning a surface of the wafer between setting the wafer ID as the ID code of the semiconductor manufacturing company and forming the semiconductor integrated circuit layer on the wafer.

8. A method of processing a wafer, the method comprising:
   receiving a wafer, which has not undergone any processing, having a wafer identification (ID) assigned by a wafer manufacturing company;
   mapping a wafer ID with an ID code for processing the wafer in a semiconductor manufacturing company without performing a laser marking process for forming the ID code of the wafer;
   pre-processing a surface of the wafer after mapping the wafer ID with the ID code;
   forming a layer on the wafer;
   forming a photoresist film on the layer;
   exposing the photoresist film to expose an edge portion of the wafer; and
   etching the layer using the photoresist film as an etch mask,
   wherein the edge portion of the wafer has a size including the wafer ID.

* * * * *